US010233126B2

(12) United States Patent
Harris et al.

(10) Patent No.: US 10,233,126 B2
(45) Date of Patent: Mar. 19, 2019

(54) FORMING A CERAMIC MATRIX COMPOSITE HAVING A SILICIDE LAYER

(71) Applicants: Rolls-Royce High Temperature Composites Inc., Huntington Beach, CA (US); Rolls-Royce Corporation, Indianapolis, IN (US)

(72) Inventors: Stephen I Harris, Long Beach, CA (US); Robert J. Shinavski, Mission Viejo, CA (US); Sungbo Shim, Irvine, CA (US); Sean E. Landwehr, Avon, IN (US)

(73) Assignees: Rolls-Royce Corporation, Indianapolis, IN (US); Rolls-Royce High Temperature Composites, Inc., Cypress, CA (US)

( * ) Notice: Subject to any disclaimer, the term of this patent is extended or adjusted under 35 U.S.C. 154(b) by 168 days.

(21) Appl. No.: 15/229,786

(22) Filed: Aug. 5, 2016

(65) Prior Publication Data

US 2017/0044070 A1    Feb. 16, 2017

Related U.S. Application Data

(60) Provisional application No. 62/204,256, filed on Aug. 12, 2015.

(51) Int. Cl.
*C23C 16/06* (2006.01)
*C04B 35/80* (2006.01)
(Continued)

(52) U.S. Cl.
CPC .......... *C04B 35/806* (2013.01); *C04B 35/565* (2013.01); *C04B 35/6286* (2013.01);
(Continued)

(58) Field of Classification Search
CPC ................ C23C 16/42; C23C 16/06
See application file for complete search history.

(56) References Cited

U.S. PATENT DOCUMENTS

| 4,582,720 A * | 4/1986 | Yamazaki ............. C23C 16/505 118/723 E |
|---|---|---|
| 5,079,195 A | 1/1992 | Chiang et al. |

(Continued)

OTHER PUBLICATIONS

Huang, Chao M., et al., "Properties and Microstructure of Molybdenum Disilicide-B'-SiAION Particulate Ceramic Composites". J. Am. Ceram. Soc., 80 [11] 2837-47 (1997).*

(Continued)

*Primary Examiner* — Bret P Chen
(74) *Attorney, Agent, or Firm* — Shumaker & Sieffert, P.A.

(57) ABSTRACT

A ceramic matrix composite component and methods of making are described herein. The ceramic matrix composite may include a silicon containing matrix and refractory fibers embedded within the silicon containing matrix. The ceramic matrix composite component may further include a silicide layer sandwiched between the silicon containing matrix and the refractory fibers. A method of forming a ceramic matrix composite may include infiltrating a fluid that includes a refractory metal element containing compound into a fiber preform that includes fibers. The method may further include depositing the refractory metal element from the refractory metal element containing compound onto the fibers and forming, from the refractory metal element deposited onto the fibers, a refractory metal silicide.

12 Claims, 2 Drawing Sheets

(51) Int. Cl.
*C04B 35/565* (2006.01)
*C04B 35/628* (2006.01)
*C04B 37/00* (2006.01)
*C23C 16/04* (2006.01)

(52) U.S. Cl.
CPC .. *C04B 35/62857* (2013.01); *C04B 35/62863* (2013.01); *C04B 35/62876* (2013.01); *C04B 35/62884* (2013.01); *C04B 35/62894* (2013.01); *C04B 35/62897* (2013.01); *C04B 37/005* (2013.01); *C04B 37/006* (2013.01); *C23C 16/045* (2013.01); *C04B 2235/3826* (2013.01); *C04B 2235/428* (2013.01); *C04B 2235/5244* (2013.01); *C04B 2235/614* (2013.01); *C04B 2235/616* (2013.01); *C04B 2237/08* (2013.01); *C04B 2237/083* (2013.01); *C04B 2237/122* (2013.01); *C04B 2237/365* (2013.01); *C04B 2237/38* (2013.01); *C04B 2237/708* (2013.01); *C04B 2237/72* (2013.01)

(56) References Cited

U.S. PATENT DOCUMENTS

| | | | |
|---|---|---|---|
| 5,149,514 A | 9/1992 | Sanjurjo | |
| 5,244,748 A | 9/1993 | Weeks et al. | |
| 5,552,352 A | 9/1996 | Brun et al. | |
| 5,834,115 A | 11/1998 | Weeks et al. | |
| 5,855,955 A * | 1/1999 | Claar | C04B 35/652 |
| | | | 427/248.1 |
| 5,914,156 A | 6/1999 | Weeks et al. | |
| 5,939,216 A * | 8/1999 | Kameda | C04B 35/08 |
| | | | 428/323 |
| 5,952,046 A | 9/1999 | Chayka | |
| 5,955,391 A | 9/1999 | Kameda et al. | |
| 5,990,025 A * | 11/1999 | Suyama | C04B 35/573 |
| | | | 428/570 |
| 6,024,898 A | 2/2000 | Steibel et al. | |
| 6,503,572 B1 | 1/2003 | Waggoner et al. | |
| 6,793,873 B2 | 9/2004 | Gadow et al. | |
| 6,919,127 B2 | 7/2005 | Waggoner et al. | |
| 7,658,781 B1 | 2/2010 | Waggoner et al. | |
| 7,951,459 B2 | 5/2011 | Tang et al. | |
| 2003/0175122 A1* | 9/2003 | Zhao | F01D 5/14 |
| | | | 416/241 B |
| 2003/0175453 A1* | 9/2003 | Steffier | B23P 15/008 |
| | | | 428/34.5 |
| 2005/0181192 A1* | 8/2005 | Steffier | B32B 18/00 |
| | | | 428/293.4 |
| 2013/0167374 A1* | 7/2013 | Kirby | C04B 35/64 |
| | | | 29/888.02 |
| 2014/0342168 A1* | 11/2014 | Lipkin | F01D 5/284 |
| | | | 428/448 |

OTHER PUBLICATIONS

Vasudevan, A.K., et al., "A comparative overview of molybdenum disilicide composites". Materials Science and Engineering: A, vol. 155, Issues 1-2, Jun. 30, 1992, pp. 1-17. Abstract Only.*

Courtright, E.L., et al., "Ultrahigh Temperature Assessment Study—Ceramic Matrix Composites". Wright Laboratory, WL-TR-91-4061, Sep. 1992, pp. 1-143.*

Gac, Frank D., et al., "Feasiblity of a Composite of SiC Whiskers in an MoSi2 Matrix". Communications of the American Ceramic Society; J. Am. Ceram. Soc., 68 [8] C-200-C-201 (1985).*

Partial European Search Report, European Application No. 16183174.8-1371, dated Dec. 21, 2016, 9 pages.

Tsirlin et al., "Polyfunctional Interface Coatings for High Temperature Resistant Ceramic Composite of SiC/SiC Type", Conf—High Temperature Ceramic Matrix Composites III. 3rd International Conference (HT-CMC 3); Sep. 6-9, 1998, Key Engineering Materials, vol. 164-165. pp. 399-404.

Extended European Search Report, European Application No. 16183174.8-1371 / 3130575, dated Mar. 30, 3017, 13 pages.

* cited by examiner

FORMING A CERAMIC MATRIX COMPOSITE HAVING A SILICIDE LAYER

CROSS REFERENCE TO RELATED APPLICATIONS

This application claims priority to and the benefit of U.S. Provisional Patent Application No. 62/204,256, filed 12 Aug. 2015, the disclosure of which is now expressly incorporated herein by reference.

FIELD OF THE DISCLOSURE

The present disclosure relates generally to gas turbine engines, and more specifically to ceramic matrix composite components.

BACKGROUND

Gas turbine engine components are exposed to high temperature environments with an increasing demand for even higher temperatures. Economic and environmental concerns relating to the reduction of emissions and the increase of efficiency are driving the demand for higher gas turbine operating temperatures. In order to meet these demands, temperature capability of the components in hot sections such as blades, vanes, blade tracks, seal segments and combustor liners may be increased.

Ceramic matrix composites (CMCs) may be a candidate for inclusion in the hot sections where higher gas turbine engine operating temperatures are required. One benefit of CMC engine components is the high-temperature mechanical, physical, and chemical properties of the CMCs which allow the gas turbine engines to operate at higher temperatures than current engines.

One possible method of manufacturing dense CMC bodies may include infiltration of a porous, rigidized fiber preform. The method may involve the infiltration of silicon carbide (SiC) particulate filled slurry. The silicon carbide from the slurry may reduce the volume fraction of remaining porosity. Liquid silicon may then be infiltrated into the remaining porosity to form a dense CMC body.

SUMMARY

The present disclosure may comprise one or more of the following features and combinations thereof.

According to an aspect of the present disclosure, a ceramic matrix composite component may include a silicon containing matrix and refractory fibers embedded within the silicon containing matrix. The ceramic matrix composite component may further include a silicide layer sandwiched between the silicon containing matrix and the refractory fibers.

According to another aspect of the present disclosure, a method of forming a ceramic matrix composite may include infiltrating a fluid that includes a refractory metal element containing compound into a fiber preform that includes fibers. The method may further include depositing the refractory metal element from the refractory metal element containing compound onto the fibers and forming, from the refractory metal element deposited onto the fibers, a refractory metal silicide.

These and other features of the present disclosure will become more apparent from the following description of the illustrative embodiments.

DETAILED DESCRIPTION OF THE DRAWINGS

Figure 1:
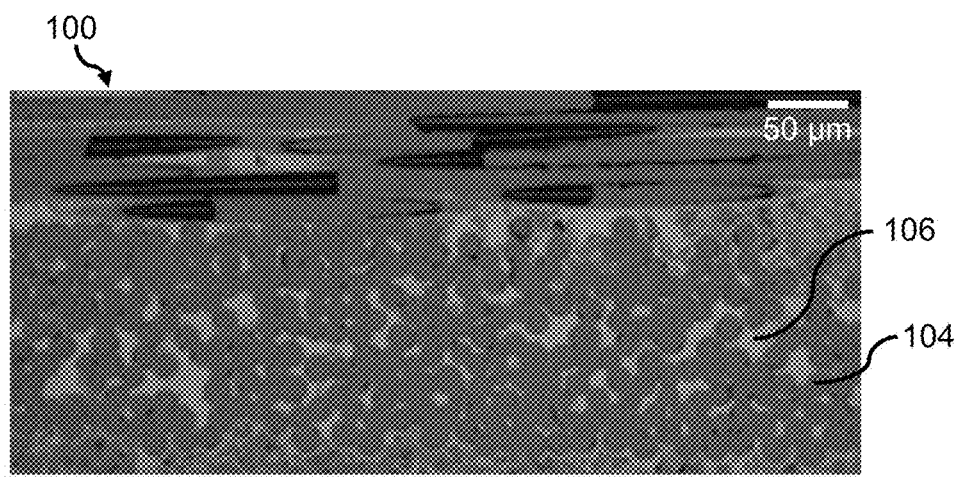
FIG. 1 is a cross-sectional micrograph of a CMC that includes SiC fibers embedded within a SiC matrix.

For the purposes of promoting an understanding of the principles of the disclosure, reference will now be made to a number of illustrative embodiments illustrated in the drawings and specific language will be used to describe the same.

Described herein are CMC components and methods of manufacturing CMC components that include a silicide layer between a matrix and fibers embedded within the matrix. The silicide layer may restrict or prevent chemical interaction between the matrix and the fibers. For example, the fibers may include one or more layers that include one or more elements that may chemically interact with one or more elements of the matrix to form dissimilar compounds that are different from the matrix compounds. The dissimilar compounds may adversely affect the mechanical properties of the CMC, and the silicide layer may restrict formation of such dissimilar compounds.

FIG. 1 is cross-sectional micrograph of a CMC component 100 that includes fibers 104 embedded within a matrix 106. The matrix 106 may comprise a ceramic material such as SiC, $Si_3N_4$, $B_4C$, $ZrB_2$, $Mo_2C$ or the like. In some examples, the matrix 106 may be a silicon containing matrix. For example, silicon containing matrix may include or be silicon carbide. The silicon containing matrix may include other phases and/or elements other than silicon carbide, but the major phase may be silicon carbide. For example, the silicon containing matrix may include residual silicon metal.

The fibers 104 that are embedded within the matrix 106 may comprise a refractory ceramic such as SiC, $Si_3N_4$, or the like. In some examples, the fibers 104 may include silicon containing refractory fibers such as silicon carbide fibers. The silicon carbide fibers may include other phases and/or elements other than silicon carbide, but the major phase may be silicon carbide. For example, the silicon carbide fibers may include additional elements other than silicon and carbon to tailor the properties of the silicon carbide fibers. Each of the fibers may be a single fiber or filament or a bundle or tow of fibers or filaments. Furthermore, the fibers may be a plurality of two-dimensional weaved sheets of fibers stacked or a three-dimensional weave of fibers.

Figure 2:
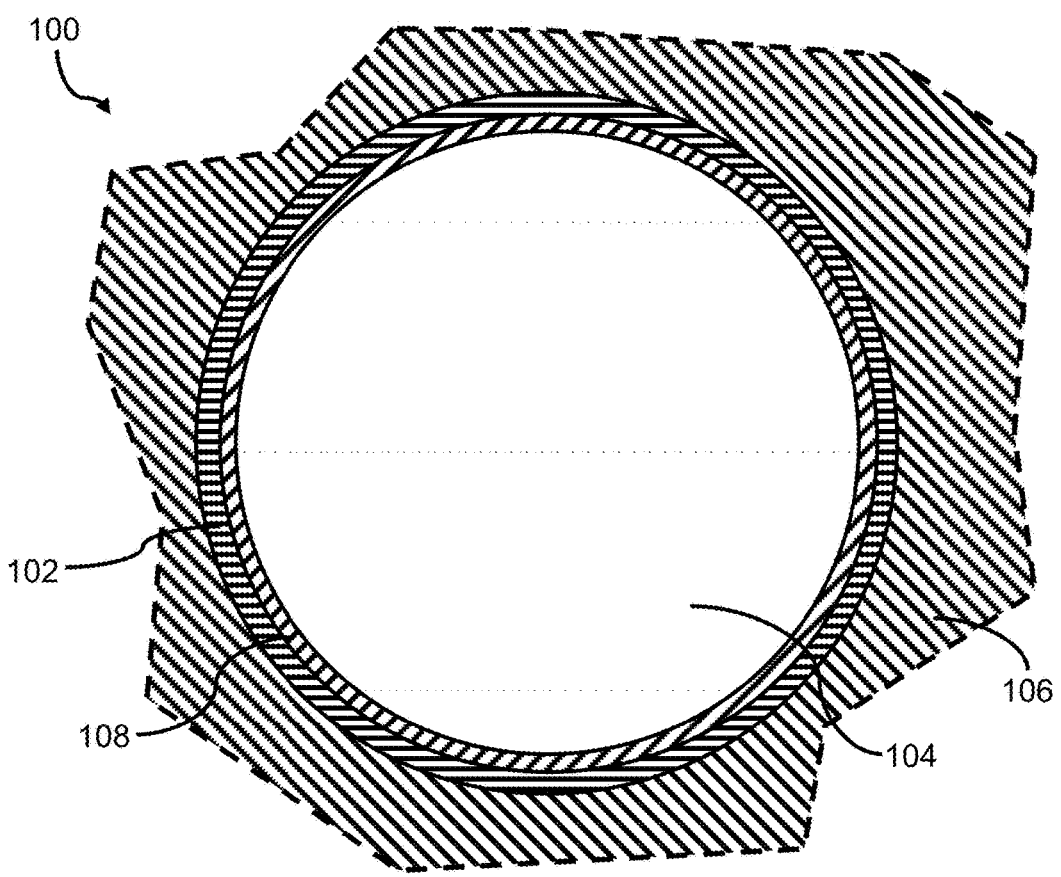
FIG. 2 is a schematic cross-sectional view of a portion, a single fiber embedded within a matrix, of an example CMC component that includes a silicide layer sandwiched between the fibers and the matrix.

FIG. 2 is a schematic of a cross-sectional view of a portion of an example CMC component 100. In particular, FIG. 2 illustrates a cross-section through a single fiber 104 and the surrounding matrix 106. The fibers 104 may include one or more layers or coatings 108. The layer(s) 108 may be formed on the fibers 104 such that the layer(s) 108 are sandwiched between the fibers 104 and the matrix 106. The layer(s) 108 may include a silicon carbide layer and/or a boron nitride layer. For example, a boron nitride layer may be sandwiched between the fibers 104 and a silicon carbide layer. The silicon carbide layer may be distinct from or separate from the silicon containing matrix 106.

The CMC component 100 further includes a silicide layer 102 sandwiched between the fibers 104 and the matrix 106. When the fibers 104 include the layer(s) 108, the layer(s) 108 may be sandwiched between the fibers 104 and the silicide layer 102. The major phase of the silicide layer 102 may be a silicide. The silicide may include a refractory metal element. For example, the refractory metal element may include molybdenum, tungsten, tantalum or a combination thereof. Thus, the silicide may be molybdenum silicide, tungsten silicide, tantalum silicide or a combination thereof. The silicide layer 102 may form a chemical barrier between the fiber 104 and the matrix 106. For example, the silicide layer 102 may restrict or prevent chemical interaction between the matrix 106 and the fibers 104. As described above, the fibers 104 may include one or more layers 108. The layers 108 may include one or more elements that may chemically interact or react with one or more elements or phases of the matrix 106 such as residual silicon metal. The silicide layer 102 may substantially restrict such chemical interactions or reactions between the matrix 106 and the fibers 104. For example, the silicide layer 102 may restrict or substantially prevent diffusion or migration of elements between the fibers 104 and the matrix 106. The silicide layer 102 may be chemically stable at elevated temperatures (e.g., greater than about 1500° C.). Thus, the silicide layer 102 may not substantially react with or diffuse into the matrix 106, and the matrix 106 may include substantially zero of the refractory metal element of the silicide. The matrix 106 may include a refractory metal element that is the same as the refractory metal element of the silicide layer 102 to tailor the properties of the matrix 106; however, the refractory metal element of the silicide layer 102 may not substantially diffuse into the matrix 106 resulting in a change in composition of the matrix 106. The silicide layer 108 may have a thickness of about 0.1 μm to about 5 μm. Furthermore, the silicide layer 108 may cover substantially all surfaces of the fibers 104.

Figure 3:
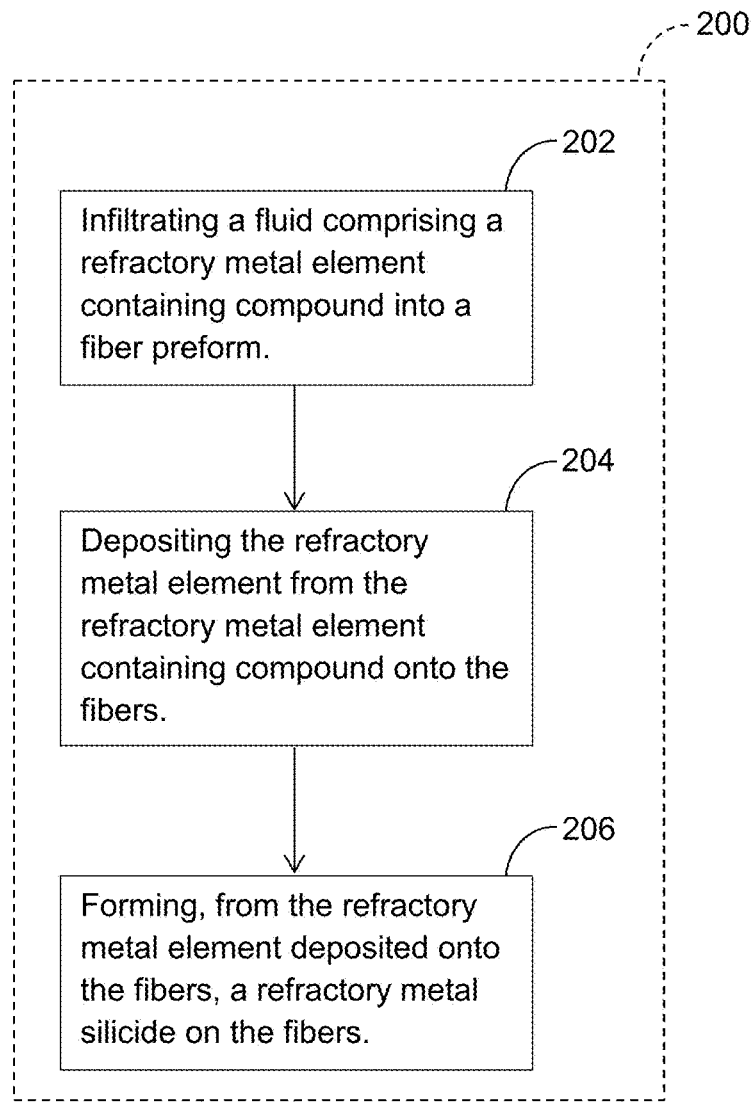
FIG. 3 is a flowchart of an example method of forming a CMC that includes a silicide layer between the fibers and the matrix.

FIG. 3 is an example method 200 of forming a ceramic matrix composite. As shown by operational block 202, the method 200 may include infiltrating a fluid comprising a refractory metal element containing compound into a fiber preform. The fiber preform may include refractory fibers such as ceramic fibers, as described above. For example, the ceramic fibers may include silicon containing refractory fibers such as silicon carbide. The silicon containing refractory fibers may further include one or more distinct layers, also as described above. For example, the silicon containing refractory fibers may include a silicon carbide fiber with a silicon carbide layer that surrounds the silicon carbide fiber. The silicon containing refractory fibers may further include a layer of boron nitride sandwiched between the silicon carbide fiber and the silicon carbide layer. Each of the fibers may be a single fiber or filament or a bundle or tow of fibers or filaments. The fiber preform may be formed from stacking a plurality of weaved sheets of refractory fibers or the fiber preform may be formed from a three-dimensional weave of refractory fibers.

The fiber preform may have voids or porosity between the fibers that may be infiltrated with the fluid such as through chemical vapor infiltration (CVI). The fluid may include the refractory metal element containing compound. The fluid may be a gas or liquid. For example, the refractory metal element containing compound may be in a gas state during infiltration. The fluid may include additional components to facilitate infiltration of refractory metal element containing compound. For example, the fluid may include an inert gas such as argon.

The refractory metal element containing compound includes a least one refractory metal element. The refractory metal element may include molybdenum, tungsten, tantalum or a combination thereof. The refractory metal element containing compound may include molybdenum chloride, tungsten chloride, tantalum chloride or a combination thereof. Other example refractory metal element containing compounds may include precursors from the carbonyl family. In the example of molybdenum chloride, molybdenum chloride may be formed by passing a reactive chlorine containing gas through a molybdenum sponge.

The refractory metal element containing compound may be infiltrated into the preform by surrounding the fiber preform with the refractory metal element containing compound. During infiltration, the fluid may be a gas and have a pressure of about 1 Torr to about 20 Torr. The infiltration may occur within a hermetically sealed chamber in order to control the environment during infiltration. For example, a negative pressure or vacuum environment may be created within the chamber followed by introduction of the refractory metal element containing compound into the chamber.

As shown by operational block 204, the method 200 may include depositing the refractory metal element from the refractory metal element containing compound onto the fibers of the fiber preform. A reducing constituent may be put into chemical interaction with the refractory metal element containing compound to separate the refractory metal element from the refractory metal element containing compound. For example, the reducing constituent may include hydrogen. After the refractory metal element is separated from the refractory metal element containing compound, the refractory metal element may deposit onto the fibers. The refractory metal element may form a refractory metal phase on the fibers. As described above, the refractory metal element may include molybdenum, tungsten, tantalum or a combination thereof. Thus, the refractory metal may include molybdenum metal, tungsten metal, tantalum metal or a combination thereof. The gas that is infiltrated into the perform may include hydrogen, and in the example of molybdenum, the method may include chemically interacting the hydrogen with molybdenum chloride to deposit the molybdenum.

Subsequent to depositing the refractory metal element onto the fibers, the fiber preform may be infiltrated with a slurry. The slurry may include particles such as silicon carbide, carbon or a combination thereof. Furthermore, the slurry may include substantially zero amount of the refractory metal element. For example, the slurry may include less than about 1% by weight of the refractory metal element. However, the slurry may alternatively include particles that comprise a refractory metal element. The slurry may include a liquid such as water in which the particles are suspended within. After infiltration of the slurry into the fiber preform, the liquid of the slurry may be removed by evaporation of the liquid.

As shown by operational block 206, the method 200 may include forming, from the refractory metal element deposited onto the fibers, a refractory metal silicide on the fibers. The silicide may include $MoSi_2$, $WSi_2$, $TaSi_2$ or a combination thereof. Forming the refractory metal silicide on the fibers may be done subsequent to or prior to infiltrating the fiber preform with the slurry.

In one example, the method of forming the CMC may include melt infiltrating the fiber preform with a molten silicon containing metal or alloy to form the ceramic matrix composite after the slurry infiltration. The molten silicon may have a majority constituent being silicon. The melt infiltrating may be performed after the refractory metal has been formed in the fiber preform. The molten silicon may form silicon carbide with carbon in the fiber preform such as with carbon particles from the slurry. The molten silicon and the refractory metal may together further form the silicide. Thus, at least some of the refractory metal may form a silicide as a result the melt infiltration.

In another example, the refractory silicide may be formed prior to melt infiltration. After the refractory metal has been deposited onto the fibers, silicon in a gas or vapor state may be infiltrated into the preform. The silicon vapor may react with the refractory metal to form the silicide. The formation of the silicide may be done prior to or subsequent to infiltration of the slurry.

In a further example, a refractory metal carbide may be formed from the deposited refractory metal element prior to forming the refractory metal silicide. The refractory metal may react with carbon to form the refractory metal carbide. For example, the refractory metal carbide may be formed by exposing the refractory metal element to a hydrocarbon atmosphere. After forming the refractory metal carbide, a molten silicon containing metal or alloy may be infiltrated into the fiber preform to convert the refractory metal carbide to the refractory metal silicide.

Since the refractory metal element may form a refractory metal silicide with silicon metal in the CMC, the CMC may have less silicon metal than a CMC that does not include the refractory metal element. For example, the CMC may have at least about 5% by volume less silicon metal than a CMC would have without use of the refractory precursor to form the CMC. Furthermore, the CMC with the refractory metal element may have less than about 5% by volume residual porosity.

The following three prophetic examples are provided to demonstrate the benefits of certain embodiments of the disclosed methods. These examples are discussed for illustrative purposes and should not be construed to limit the scope of the disclosed embodiments.

EXAMPLE 1

A first method of forming a CMC may include deposition of a molybdenum coating through CVI prior to slurry infiltration. The method may include the following components and steps.
1) Following CVI of a SiC layer resulting in rigidization of the porous fiber preform, the fiber preform is coated with molybdenum metal by passing a reactive chlorine containing gas through a heated molybdenum sponge to form molybdenum chloride. The molybdenum chloride is then introduced into a CVI reactor along with hydrogen gas to deposit elemental molybdenum on all surfaces of the fiber preform.
2) The fiber preform is then slurry infiltrated with a SiC containing slurry to fill a major percentage of the remaining porosity.
3) The fiber preform is then melt infiltrated with molten silicon or alloy to form a stable $MoSi_2$ barrier layer and a dense composite article with less than about 5% residual porosity.

EXAMPLE 2

A second method of forming a CMC may include deposition of a molybdenum coating through CVI, then reaction forming molybdenum carbide using a heat treatment in a hydrocarbon atmosphere, then slurry infiltrating the fiber preform, and then melt infiltrating the fiber preform with a molten silicon metal or alloy to form a molybdenum disilicide silicon layer as well as additional silicon carbide to further reduce the amount of residual silicon metal in the component. The method may include the following components and steps.
1) Following CVI of a SiC layer resulting in rigidization of the porous fiber preform, the fiber preform is coated with molybdenum metal by passing a reactive chlorine containing gas through a heated molybdenum sponge to form molybdenum chloride. The molybdenum chloride is then introduced into a CVI reactor along with hydrogen gas to deposit elemental molybdenum on all surfaces of the fiber preform.
2) Heat treating the fiber preform in methane at about 1000° C. to convert the molybdenum to $Mo_2C$.
3) The fiber preform is then slurry infiltrated with a SiC containing slurry to fill a major percentage of the remaining porosity.
4) The body is melt infiltrated with molten silicon metal or alloy to form a stable $MoSi_2$ barrier layer and additional silicon carbide resulting in a dense composite article with less than about 5% residual porosity and a lower residual silicon metal content.

EXAMPLE 3

A third example method of forming a CMC may include depositing molybdenum metal followed by vapor phase siliciding the molybdenum metal prior to slurry infiltration to form the molybdenum silicide layer. The method may include the following components and steps.
1) Depositing molybdenum into the fiber preform and onto the fibers. Forming molybdenum silicide such as $MoSi_2$, $Mo_5Si_3$ or combination thereof by introducing silicon vapor into the fiber preform.
2) Slurry infiltrating the fiber preform with a SiC slurry to further reduce the residual porosity in the body.
3) Melt infiltrating the fiber preform with molten silicon metal or alloy. Converting $Mo_5Si_3$ (if present) to $MoSi_2$ to form a stable $MoSi_2$ layer. A dense composite article with less than about 5% residual porosity is formed.

While the disclosure has been illustrated and described in detail in the foregoing drawings and description, the same is to be considered as exemplary and not restrictive in character, it being understood that only illustrative embodiments thereof have been shown and described and that all changes and modifications that come within the spirit of the disclosure are desired to be protected.

What is claimed is:
1. A method of forming a ceramic matrix composite comprising:
   prior to infiltrating a fiber preform comprising fibers with a slurry, infiltrating a fluid comprising a refractory metal element containing compound into the fiber preform comprising fibers;
   depositing the refractory metal element from the refractory metal element containing compound onto the fibers;
   forming, from the refractory metal element deposited onto the fibers, a refractory metal silicide by at least exposing the refractory metal element to a silicon vapor; and
   infiltrating the fiber preform with the slurry.
2. The method of claim 1, wherein the refractory metal element comprises molybdenum, tungsten, tantalum or a combination thereof.

3. The method of claim 1, wherein the refractory metal element containing compound comprises molybdenum chloride.

4. The method of claim 1, wherein the depositing the refractory metal element comprises forming a refractory metal layer comprising the refractory metal element on the fibers, and wherein the forming the refractory metal silicide comprises forming a refractory metal silicide-containing layer on the fibers.

5. The method of claim 4, wherein the slurry comprises silicon carbide.

6. The method of claim 5, further comprising melt infiltrating the fiber preform with a molten silicon containing metal or alloy after infiltrating the fiber preform with the slurry.

7. The method of claim 6, wherein the refractory metal silicide-containing layer substantially restricts chemical diffusion between the fibers and a silicon containing matrix formed as a result of the melt infiltrating.

8. The method of claim 1, further comprising:
wherein infiltrating the fiber preform with the slurry comprises infiltrating the fiber preform with a slurry comprising silicon carbide; and
melt infiltrating the fiber preform with a molten silicon containing metal or alloy,
wherein silicon from the silicon containing metal or alloy and the refractory metal element form at least a portion of the refractory metal silicide.

9. The method of claim 1, further comprising forming a refractory metal carbide from the refractory metal element deposited from the refractory metal containing compound prior to forming the refractory metal silicide.

10. The method of claim 9, further comprising melt infiltrating the fiber preform with a molten silicon containing metal or alloy to convert the refractory metal carbide to the refractory metal silicide.

11. A method of forming a ceramic matrix composite, the method comprising:
prior to infiltrating a fiber preform comprising fibers with a slurry, infiltrating a fluid comprising a refractory metal element containing compound into the fiber preform;
depositing the refractory metal element from the refractory metal element containing compound onto the fibers;
forming, from the refractory metal element deposited onto the fibers, a refractory metal silicide by at least exposing the refractory metal element to a silicon vapor;
infiltrating the fiber preform with a slurry; and
melt infiltrating the fiber preform with a molten silicon containing metal or alloy.

12. The method of claim 11, wherein the slurry comprises silicon carbide.

* * * * *